United States Patent
Hofer et al.

(10) Patent No.: US 10,520,109 B2
(45) Date of Patent: Dec. 31, 2019

(54) VACUUM VALVE WITH OPTICAL SENSOR

(71) Applicant: VAT Holding AG, Haag (CH)

(72) Inventors: Andreas Hofer, Widnau (CH); Christoph Böhm, Gams (CH); Adrian Eschenmoser, Grabs (CH)

(73) Assignee: VAT HOLDING AG, Haag (CH)

(*) Notice: Subject to any disclaimer, the term of this patent is extended or adjusted under 35 U.S.C. 154(b) by 0 days.

(21) Appl. No.: 15/916,745

(22) Filed: Mar. 9, 2018

(65) Prior Publication Data

US 2018/0259075 A1    Sep. 13, 2018

(30) Foreign Application Priority Data

Mar. 9, 2017 (EP) .................................... 17160094

(51) Int. Cl.
| | |
|---|---|
| *F16K 37/00* | (2006.01) |
| *F16K 51/02* | (2006.01) |
| *F16K 3/10* | (2006.01) |
| *F16K 3/18* | (2006.01) |
| *H01L 21/67* | (2006.01) |

(52) U.S. Cl.
CPC ............ *F16K 37/0058* (2013.01); *F16K 3/10* (2013.01); *F16K 3/18* (2013.01); *F16K 37/0041* (2013.01); *F16K 37/0091* (2013.01); *F16K 51/02* (2013.01); *H01L 21/67017* (2013.01); *F16K 37/0025* (2013.01)

(58) Field of Classification Search
CPC ............ F16K 37/0025; F16K 37/0041; F16K 37/0058; F16K 37/0091; F16K 3/10; F16K 3/18; F16K 51/02; H01L 21/67017
See application file for complete search history.

(56) References Cited

U.S. PATENT DOCUMENTS

| | | | |
|---|---|---|---|
| 3,145,969 A | | 8/1964 | Zweck |
| 4,052,036 A | * | 10/1977 | Schertler ............... F16K 3/184 |
| | | | 251/144 |

(Continued)

FOREIGN PATENT DOCUMENTS

| | | |
|---|---|---|
| DE | 1264191 B1 | 3/1968 |
| DE | 7731993 U1 | 1/1978 |

(Continued)

OTHER PUBLICATIONS

EP 17 16 0094, European Search Report, Sep. 6, 2017, pp. 1-18.

*Primary Examiner* — Gordon J Stock, Jr.
(74) *Attorney, Agent, or Firm* — Muncy, Geissler, Olds & Lowe, P.C.

(57) ABSTRACT

A vacuum valve system having a valve seat and a valve closure for closing the valve opening. At least two sealing faces are provided, a first sealing face is the valve seat around the valve opening, and a second sealing face is the valve closure. A drive unit coupled to the valve closure designed so that the valve closure can be adjusted to provide respective valve opening states and is movable from an open position to a closed position, in which the second sealing face is pressed in the direction of the first sealing face and the valve opening in a gastight manner. The vacuum valve system has an optical sensor unit, designed to detect an optical measurement signal and an optical detection axis of the optical sensor unit oriented so that the measurement signal can be detected, and can be produced in a test position.

17 Claims, 2 Drawing Sheets

(56) References Cited

U.S. PATENT DOCUMENTS

Figure 1:
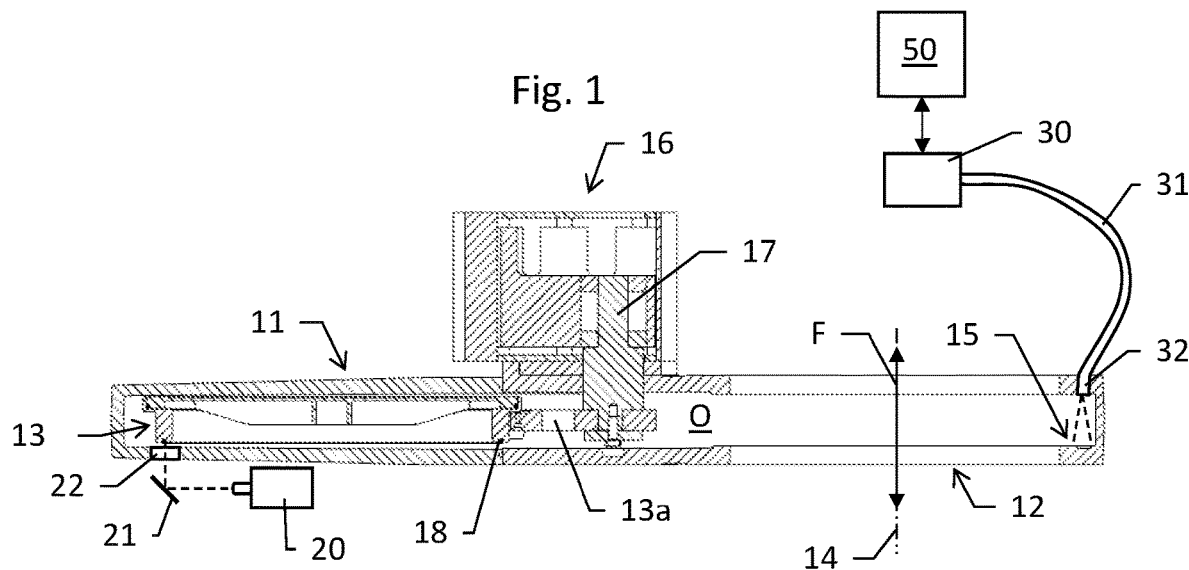

| | | | | |
|---|---|---|---|---|
| 4,299,251 | A * | 11/1981 | Dugas | A61B 5/02152 |
| | | | | 137/554 |
| 5,331,152 | A * | 7/1994 | Fenton | F16K 37/0058 |
| | | | | 250/227.11 |
| 5,577,707 | A | 11/1996 | Brida | |
| 5,584,319 | A * | 12/1996 | Cholin | F16K 37/0058 |
| | | | | 137/551 |
| 6,056,266 | A | 5/2000 | Blecha | |
| 6,089,537 | A | 7/2000 | Olmsted | |
| 6,416,037 | B1 | 7/2002 | Geiser | |
| 6,629,682 | B2 | 10/2003 | Duelli | |
| 6,895,130 | B1 * | 5/2005 | Mengle | F16K 37/0041 |
| | | | | 250/227.11 |
| 8,091,860 | B2 * | 1/2012 | Thompson | F16K 3/246 |
| | | | | 137/554 |
| 8,132,782 | B2 * | 3/2012 | Duelli | F16K 3/18 |
| | | | | 251/193 |
| 8,141,847 | B2 * | 3/2012 | Fischer | F16K 3/18 |
| | | | | 137/2 |
| 9,810,346 | B2 * | 11/2017 | Scherer | F16K 37/005 |
| 9,907,943 | B2 * | 3/2018 | Grant | A61M 5/14586 |
| 2005/0067603 | A1 | 3/2005 | Lucas et al. | |
| 2008/0237516 | A1 * | 10/2008 | Hansson | B41F 7/30 |
| | | | | 251/129.01 |

FOREIGN PATENT DOCUMENTS

| | | | | |
|---|---|---|---|---|
| DE | 3447008 | C2 | 6/1986 | |
| DE | 102007034927 | A1 | 2/2009 | |
| DE | 102008050251 | A1 * | 4/2010 | ......... F16K 37/0058 |
| DE | 102014008170 | A1 | 12/2015 | |
| FR | 2590019 | A * | 5/1987 | |
| JP | 2012127364 | A * | 7/2012 | ......... F16K 37/0058 |
| KR | 101410793 | B1 | 6/2014 | |
| WO | WO-02097313 | A1 * | 12/2002 | ......... F16K 37/0058 |
| WO | WO-2004008074 | A2 * | 1/2004 | ......... F16K 37/0058 |
| WO | 2012096618 | A1 | 7/2012 | |

* cited by examiner

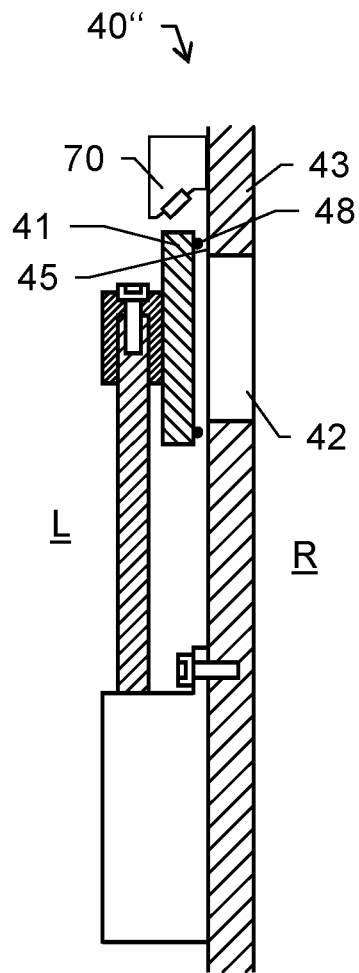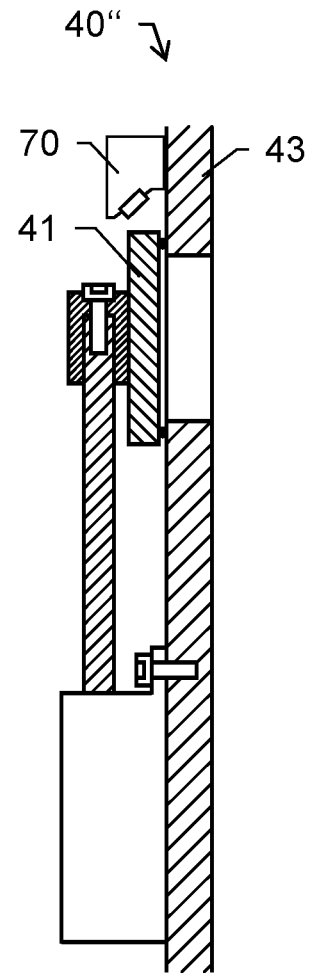
Fig. 2c    Fig. 2d
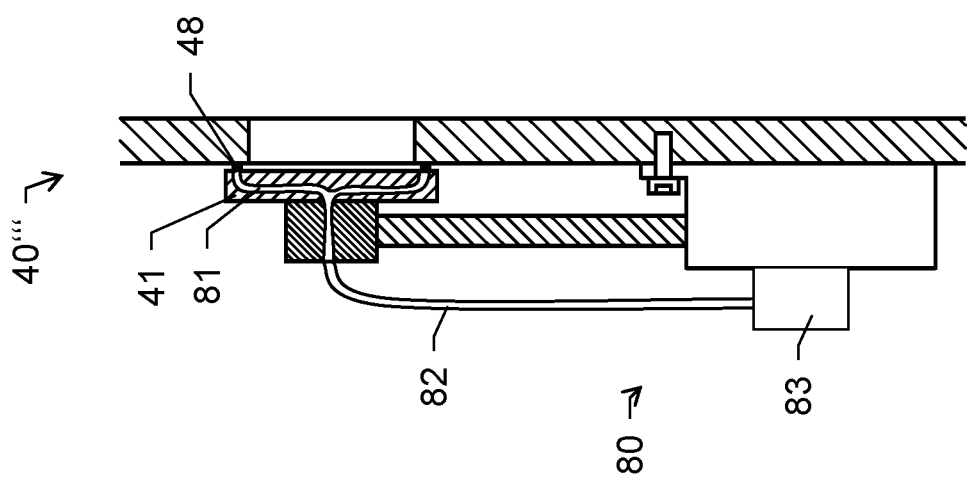
Fig. 3

VACUUM VALVE WITH OPTICAL SENSOR

CROSS REFERENCE TO RELATED APPLICATIONS

This application claims priority to European Patent Application No. 17160094.3, which was filed in the European Patent Office on Mar. 9, 2017, and which is herein incorporated by reference in its entirety.

The invention relates to a system formed of a vacuum valve and an optical sensor unit.

Vacuum valves for controlling a volume flow or mass flow and for the substantially gastight closure of a flow path leading through an opening formed in a valve housing are known in general in different embodiments from the prior art and are used in particular in vacuum chamber systems in the field of IC, semiconductor or substrate manufacture, which must take place in a protected atmosphere, where possible without the presence of contaminating particles. Vacuum chamber systems of this kind in particular comprise at least one vacuum chamber for receiving semiconductor elements or substrates that are to be worked or produced, which vacuum chamber can be evacuated and has at least one vacuum chamber opening, through which the semiconductor elements or other substrates can be guided into and from the vacuum chamber, and also comprise at least one vacuum pump for evacuating the vacuum chamber. For example, in a manufacturing facility for semiconductor wafers or liquid-crystal substrates, the highly sensitive semiconductor or liquid-crystal elements pass sequentially through a plurality of process vacuum chambers, in which the parts located within the process vacuum chambers are worked, in each case by means of a working device. Both during the working process within the process vacuum chambers and during the transport from chamber to chamber, the highly sensitive semiconductor elements or substrates must always be located within a protected atmosphere—in particular in an airless environment.

For this purpose, peripheral valves are used on the one hand in order to open and close a gas inlet or outlet, and transfer valves are used on the other hand in order to open and close the transfer openings of the vacuum chambers for the introduction and discharge of the parts.

The vacuum valves passed through by semiconductor parts are also referred to as vacuum transfer valves on account of the described field of application and the associated dimensioning, as rectangular valves on account of their predominantly rectangular opening cross-section, and as gate valves, rectangular gate valves or transfer gate valves on account of their usual operating principle.

Peripheral valves are used in particular for open-loop or closed-loop control of the gas flow between a vacuum chamber and a vacuum pump or a further vacuum chamber. Peripheral valves are located for example within a pipe system between a process vacuum chamber or a transfer chamber and a vacuum pump, the atmosphere, or a further process vacuum chamber. The opening cross-section of valves of this kind, also referred to as pump valves, is generally smaller than in the case of a vacuum transfer valve. Since peripheral valves, depending on the field of use, are not only used to fully open and close an opening, but also for open-loop or closed-loop control of a flow rate by continuous adjustment of the opening cross-section between a fully open position and a gastight closed position, they are also referred to as control valves. A potential peripheral valve for open-loop or closed-loop control of the gas flow is the pendulum valve.

In the case of a typical pendulum valve, as is known for example from U.S. Pat. No. 6,089,537 (Olmsted), a generally round valve disc is pivoted in a rotary manner in a first step over an opening, which is likewise generally round, from a position releasing the opening into an intermediate position covering the opening. In the case of a gate valve, as is described for example in U.S. Pat. No. 6,416,037 (Geiser) or U.S. Pat. No. 6,056,266 (Blecha), the valve disc, similarly to the opening, is usually rectangular and in this first step is slid in a linear manner from a position releasing the opening into an intermediate position covering the opening. In this intermediate position, the valve disc of the pendulum valve or gate valve is opposite and spaced apart from the valve seat surrounding the opening. In a second step the distance between the valve disc and the valve seat is made smaller, so that the valve disc and the valve seat are pressed uniformly against one another and the opening is closed in a substantially gastight manner. This second movement is performed preferably substantially in a perpendicular direction relative to the valve seat. For example, the seal can be provided either by means of a ring seal, which is arranged on the closure side of the valve disc and which is pressed onto the valve seat surrounding the opening, or by means of a ring seal on the valve seat, against which the closure side of the valve disc is pressed. By means of the closing operation performed in two steps, the sealing ring between the valve disc and the valve seat is hardly subjected to shear forces, which would destroy the sealing ring, since the movement of the valve disc in the second step is performed substantially in a straight line, perpendicularly to the valve seat.

Different sealing devices are known from the prior art, for example from U.S. Pat. No. 6,629,682 B2 (Duelli). A suitable material for ring seals and seals in vacuum valves is, for example, fluoro rubber, also referred to as FPM, in particular the fluoroelastomer known by the trade name "Viton", and perfluoro rubber (FFPM for short).

Different drive systems for attaining this combination of a rotary movement (in the case of a pendulum valve) and a movement in translation (in the case of a gate valve) of the valve disc over the opening and of a movement substantially in translation perpendicularly to the opening are known from the prior art, for example from U.S. Pat. No. 6,089,537 (Olmsted) for a pendulum valve and from U.S. Pat. No. 6,416,037 (Geiser) for a gate valve.

The valve disc must be pressed onto the valve seat in such a way that the required gas-tightness is ensured within the entire pressing region and also damage to the sealing medium, in particular the sealing ring in the form of an O-ring, as a result of excessive compressive stress is avoided. In order to ensure this, known valves provide control of the contact pressure of the valve disc, this being controlled depending on the pressure difference prevailing between the two sides of the valve disc. Particularly in the case of large pressure fluctuations or the change from negative pressure to overpressure, or vice versa, however, it is not always possible to ensure a uniform distribution of force along the entire periphery of the sealing ring. It is generally sought to decouple the sealing ring from supporting forces resulting from the pressure applied to the valve. To this end, U.S. Pat. No. 6,629,682 (Duelli) for example proposes a vacuum valve with a sealing medium, which is composed of a sealing ring and an adjacent supporting ring, so that the sealing ring is substantially feed from supporting forces.

In order to achieve the required gas-tightness, as necessary both for overpressure and negative pressure, some known pendulum valves or gate valves, in addition or alternatively to the second movement step, provide a valve ring, which surrounds the opening, is displaceable perpendicularly to the valve disc, and is pressed against the valve disc in order to close the valve in a gastight manner. Valves of this kind with valve rings that are actively displaceable relative to the valve disc are known for example from DE 1 264 191 B1, DE 34 47 008 C2, U.S. Pat. No. 3,145,969 (by Zweck) and DE 77 31 993 U. In U.S. Pat. No. 5,577,707 (Brida) a pendulum valve with a valve housing having an opening and with a valve disc pivotable in parallel above the opening for controlling a flow rate through the opening is described. A valve ring that surrounds the opening is movable actively perpendicularly in the direction of the valve disc by means of a plurality of springs and pneumatic cylinders. A possible development of this pendulum valve is proposed in US 2005/0067603 A1 (Lucas et al.).

Since the above-mentioned valves are used inter alfa in the production of highly sensitive semiconductor elements in a vacuum chamber, a corresponding sealing effect must also be reliably ensured for process chambers of this kind. To this end, the state of a sealing material and or a sealing face that is in contact with the sealing material at the time of pressing is of particular significance. During the course of the service life of a vacuum valve, general wear of the sealing material or the sealing faces can occur.

In order to avoid a potential resultant leak or in order to keep the quality of the seal at a constant sufficiently high level, a valve closure is typically replaced or renewed at certain time intervals. A maintenance cycle of this kind is usually determined on the basis of the number of anticipated opening and closing cycles within a certain period of time. The maintenance is thus usually performed carefully so as to be able to rule out the occurrence of a leak in advance, to the greatest possible extent.

A servicing requirement of this kind is not limited solely to the sealing material or the valve disc, but in particular also extends to the valve seat, which forms a part of the vacuum valve corresponding to the valve disc. The structure of a sealing face of the valve seat, for example a groove formed in the valve seat, is also affected by a mechanical loading. A structural modification of the groove resulting from operation of the valve can therefore also be detrimental to the seal. Corresponding maintenance intervals are usually defined for this reason as well.

A disadvantage of this valve maintenance lies in the careful manner in which it is performed. The parts affected by the maintenance are usually renewed or replaced before their regular or actual service life has elapsed. Each maintenance step of this kind generally involves a certain downtime for a production process and an increased technical and financial outlay. This then signifies, on the whole, a downtime of the production at intervals that are shorter than necessary, and more frequently than should generally be required.

The object of the invention is therefore to provide an improved vacuum valve system which allows optimised valve maintenance and therefore an improvement, i.e. a reduction, of possible process downtimes.

A further object of the invention is to provide a valve system of this kind with which a more reliable sealing of a process volume can be achieved, in particular wherein the quality of the seal can be predicted.

These objects are achieved by the implementation of the characterising features of the independent claims. Features that develop the invention in an alternative or advantageous way can be inferred from the dependent claims.

The fundamental concept of the present invention is to combine a vacuum valve with an optical sensor and to design the valve and the optical sensor such that they can be used to monitor one of the sealing faces of the vacuum valve. Optical measurement signals from the sealing face or a sealing material can then be detected using the sensor, and state information regarding the scanned region can be derived on the basis of these signals.

Information relating to the sealing face state is thus hereby accessible. Any change, whether in respect of the chemical composition or the structural design of the sealing face (sealing material), can thus be monitored and continuously assessed. A maintenance or replacement time for the sealing face can be determined by means of the data that can be produced in this way. For example, a failure of the tightness of the valve can thus be largely predicted and a (temporally) selective coordinated countermeasure can be taken. Maintenance intervals can thus be better scheduled and performed more efficiently, wherein at the same time the process integrity is preserved and safeguarded.

For example, a surface behaviour (pressability), a colour (for example of the sealing material), a chemical composition, a shape and/or a soiling in the measurement region can be used as relevant state information for the sealing face or an elastomer sealing material.

The invention relates to a vacuum valve system comprising a vacuum valve for controlling a volume flow or mass flow and/or for sealing off a process volume in a gastight manner, wherein the vacuum valve has a valve seat, which runs around a valve opening defining an opening axis, and a valve closure, in particular a valve disc, for closing the valve opening in a substantially gastight manner.

Here, the valve seat can be an integral part of the vacuum valve and in particular can embody part of the valve housing. Alternatively, the valve seat can be formed by the opening of a vacuum chamber and can form a vacuum valve in the sense of the present invention in cooperation with a valve closure movable relative to the valve seat.

The vacuum valve additionally has at least two sealing faces, wherein a first sealing face of the at least two sealing faces is provided by the valve seat and runs around the valve opening, and a second sealing face of the at least two sealing faces is provided by the valve closure and is formed correspondingly to the first sealing face.

In particular, one of the two sealing faces comprises a sealing material. The sealing material for example can be a polymer-based material (for example elastomer, in particular fluoroelastomer), which is cured onto the sealing face or is present as an O-ring in a groove in the valve closure or the valve seat. Within the scope of the invention, sealing faces are thus preferably considered to be those faces between which a sealing material is present in a pressed state in order to close the valve opening (closed position).

A drive unit is coupled to the valve closure and is designed in such a way that the valve closure can be varied and adjusted in a defined manner in order to provide respective valve opening states defined by respective positions of the valve closure. The valve closure is movable from an open position, in which the valve closure at least partially releases the valve opening, into a closed position, in which the second sealing face is pressed in the direction of the first sealing face and the valve opening is closed in a substantially gastight manner, and back.

The drive unit for example is formed as an electric motor (stepper motor) or as a combination of a plurality of motors or as a pneumatic drive. In particular, the drive provides a movement of the valve closure in at least two (substantially orthogonal) directions.

The vacuum valve system additionally has an optical sensor unit, wherein the optical sensor unit is designed to detect an optical measurement signal. The sensor unit is arranged in such a way, and an optical detection axis (or a detection region defined by the detection axis) of the optical sensor unit is oriented in such a way that the measurement signal with respect to at least part of one of the sealing faces can be detected. The measurement signal can be generated in a test position of the valve closure. The test position corresponds here in particular to the open position, an intermediate position, or the closed position of the valve closure.

The detection axis, for example an optical axis of a camera of the sensor unit, is preferably oriented in the direction of one of the sealing faces to be tested, so that at least part of the sealing face lies in a detection region (field of view) of the camera and an image of this part can be recorded.

In accordance with one embodiment, the measurement signal with respect to at least part of one of the sealing faces can be generated only in a certain test position of the valve closure. The detection axis and the valve for example can thus be designed so that the sealing face of the valve closure is present in the detection region around the detection axis only in the open valve position. For example, each time the valve is opened, a current state can thus be recorded, and the current quality of the sealing face can thus be ascertained.

In particular, the vacuum valve defines a vacuum region that is separated from an outer environment, for example the geometric region within a vacuum chamber.

In one embodiment of the invention, the optical sensor unit can be arranged at least in part within the vacuum region, and the detection axis can be oriented in the direction of the valve seat in order to detect the optical measurement signal for the second sealing face. By means of an arrangement of this kind, it is advantageously possible in particular to check the sealing face of a valve seat arranged inwardly (in a process volume). For this purpose, the sensor unit for example can be embodied in an integrated, compact design and can be arranged flush on a chamber wall.

The vacuum valve system can also have a transmission window permeable at least for the optical measurement signal. A measuring radiation, which is to be emitted and/or received by the sensor unit, can be transmitted from the vacuum region into the outer environment and vice versa by means of the transmission window. With a detector arranged outside the vacuum region, a signal for a sealing face located in the vacuum region can thus be received, and corresponding information can be produced whilst retaining the vacuum. Here, it is advantageous in particular that for example a power supply for the detector and the detector itself do not have to be introduced into the vacuum region, and therefore a relatively low structural outlay can be ensured.

In other words, the optical sensor unit can be arranged in the outer environment in such a way that the optical measurement signal can be detected via the transmission window by means of the optical sensor unit, in particular wherein the detection axis of the sensor unit lies within the transmission window, that is to say extends through the transmission window.

In accordance with a specific embodiment of the invention, the transmission window can form at least part of one of the at least two sealing faces. If, for example, the window is provided as part of the second sealing face and the second sealing face comprises a sealing material, information with regard to the rear side of the sealing material can thus be produced. By means of the transmission window arranged in this way, an interface or a boundary layer between the sealing material and substrate is accessible. For example, the state of an adhesive bond between the sealing material and the substrate supporting the sealing material can be examined as a result.

The optical sensor unit can comprise an optical fibre for detecting and guiding the optical measurement signal. Alternatively, an optical path can be formed in a free space optics for this purpose. The optical fibre for example can extend into the valve closure and can be coupled to the adhesive surface for a sealing material on the valve closure. The fibre can also extend through a chamber wall of a vacuum chamber and can thus enable a measurement in the chamber interior.

For example, at least part of the optical fibre, in particular a fibre end (with ferrule), can be present in the vacuum region and can be arranged and oriented to detect the optical measurement signal for at least one of the at least two sealing faces.

The optical sensor unit can also be connected to the valve closure by means of the fibre or in free space optics, in particular wherein the sensor unit, for example an optical fibre of the sensor unit, is integrated at least in part in the valve closure.

In one embodiment, the optical sensor unit can comprise a beam detection module, wherein the beam detection module has a camera, an infrared detector, in particular a near-infrared detector, in particular an NIR spectrometer, a scattered light sensor and/or a Raman detector. Different sensor systems with accordingly different chemical, structural or image-based analysis possibilities are thus conceivable. For example, a roughness analysis can be performed by means of an optical recording of a sealing face, or a chemical analysis can be performed by spectroscopy.

Alternatively or additionally, the sensor unit for example can comprise a line sensor. This can be advantageous in particular for scanning an accordingly formed sealing face. The sealing face can be scanned hereby more quickly over the entire region to be scanned.

In accordance with the invention the vacuum valve system can comprise a processing unit 50 formed in such a way that a detected measurement signal can be processed by means of the processing unit 50 and state information can be produced on the basis of the detected measurement signal. The detected measurement signals can be further processed to provide user information that can be assessed.

The state information can provide in particular information regarding a mechanical and/or structural integrity of the first or second sealing face. For example, on the basis of an image of part of a sealing face, it is thus possible to assess whether a required sealing effect will be achieved with the structure of the sealing face identifiable in the image. In particular, any soiling or damage to the sealing face can be identified.

The state information can thus be produced by means of image processing and/or by means of an actual-target comparison for the detected measurement signal. The basis for this is provided here preferably by a currently recorded visual image of the sealing face and in particular a comparison image for the scanned region, representing a target state of the sealing face as reference.

Based on the state information, a material composition and/or change to the material composition can also be deduced for at least the scannable part of one of the at least two sealing faces. This is the case in particular when a detector (beam detection module) of the sensor unit is formed as a chemical analysis module (for example an IR spectrometer) and the state information provides a spectrally resolved intensify 7 distribution for the scanned sealing face region.

With use of a corresponding reference spectrum and by means of a comparison with the reference spectrum, changes in the chemical structure for example of the sealing material can be efficiently ascertained. On this basis, an assessment of an ageing and an associated reduction in quality of the sealing material can also be ascertained. Alternatively or additionally, the chemical composition of the examined element or material can also be determined directly from a currently produced spectrum.

In accordance with the invention the state information can be provided as a visual representation of at least the scannable part of one of the at least two sealing faces, in particular as an image of at least the scannable part of the sealing face.

Alternatively or additionally, the state information can be produced as a graph embodying spectroscopic measurement signals, in particular a wavelength-intensity curve. This is the case in particular when the sensor unit comprises a corresponding chemical analysis module.

The state information can also be produced as an output signal specifying a relation of the detected measurement signal to a specific tolerance value. By means of a signal of this kind (optical or acoustic), it is possible to show for example whether a process is performed within the required tolerances or whether an undesirable undershoot or overshoot of a tolerance of this kind (for example pressure level) should be anticipated.

The valve seat of the vacuum valve can be formed by a part of the vacuum valve structurally connected to the vacuum valve, in particular wherein the valve seat is formed on a housing of the vacuum valve, or can be provided by a process chamber, in particular a chamber housing.

It shall be understood that the vacuum valve and the sensor unit can be embodied in an integrated design and this system can be considered to be a specific vacuum valve accordingly.

The device according to the invention and the method according to the invention will be described in greater detail and merely by way of example hereinafter on the basis of specific exemplary embodiments depicted schematically in the drawings, wherein further advantages of the invention will also be discussed. More specifically:

FIG. 1 shows, in cross-section, a possible embodiment of a vacuum valve system according to the invention with a pendulum valve;

FIG. 2a-d show various embodiments of a vacuum valve system with a transfer valve in different closure positions; and FIG. 3 shows a further embodiment of a valve system according to the invention with a transfer valve and a sensor unit.

A possible embodiment of a valve system according to the invention with a pendulum valve is depicted in cross-section in FIG. 1. The valve for interrupting a flow path F in a substantially gastight manner has a valve housing 11, which comprises an opening 12. Here, the opening 12 has a circular cross-section. In a closed position of a valve closure 13 (valve disc), the opening 12 is closed in a gastight manner by means of the valve disc 13. The valve is shown here in an open position O of the valve disc 1.

The opening 12 is surrounded by a valve seat. This valve seat is formed by a sealing face 15, which points axially in the direction of the valve disc 13 (in the closed position), extends transversely to the opening axis 14, has, in this case, the form of a circular ring, and is formed in the valve housing 11.

The valve additionally has a valve disc 13, which is pivotable and in addition is movable substantially parallel to the opening axis 14 and in the direction of the opening axis 14.

The valve disc 13 is connected to an electric drive 16 (motor) by means of an arm 13a, which is arranged laterally on the disc and extends perpendicularly to the opening axis 14. This arm 13a is disposed, in the closed position of the valve disc 13, outside the opening cross-section of the opening 12 projected geometrically along the opening axis 14.

The electric drive 16 is formed by use of a corresponding transmission in such a way that the valve disc 13—as is conventional in the case of a pendulum valve—can be pivoted by means of a transverse movement of the drive 16 transversely to the opening axis 14 and substantially in parallel over the cross-section of the opening 12 and perpendicularly to the opening axis 14 in the form of a pivot motion about a pivot axis 17 between an open position O and an intermediate position and is linearly displaceable by means of a longitudinal movement of the drive 16 performed in parallel in the direction of the opening axis 14. In the open position O, the valve disc 13 is positioned in a retention portion arranged laterally next to the first opening 12, so that the opening 12 and the flow path F are released. In the intermediate position the valve disc 13 is positioned above the first opening 12 in a spaced-apart manner and covers the opening cross-section of the opening 12. In the closed position the opening 12 is closed in a gastight manner and the flow path F is interrupted as a result of gastight contact between the valve closure 13 (valve disc) and the sealing face 15 of the valve seat.

In order to enable automated and controlled opening and closing of the valve, the valve can provide an electronic control system, which is designed in such a way and is connected to the drive 16 in such a way that the valve disc 13 is movable accordingly in order to seal off a process volume in a gastight manner or in order to control an inner pressure of this volume.

Due to the adjustment of the valve closure 13, a particular opening cross-section is set for the valve opening 12, and therefore the potential amount of gas that can be evacuated from a process volume per unit of time it is thus set. The valve closure 13 for this purpose can have a shape deviating from a circular shape, in particular in order to achieve a media flow that is laminar to the greatest possible extent.

In the present exemplary embodiment the drive 16 is formed as an electric motor, wherein the transmission can be switched in such a way that when the drive 16 is driven this results either in the transverse movement or the longitudinal movement. The drive 16 and the transmission are electronically actuated by the control system. Transmissions of this kind, in particular with slotted lever gates, are known from the prior art. It is also possible to use a plurality of drives to effect the transverse movement and the longitudinal movement, wherein the control system takes on the actuation of the drives.

The precise control of the flow rate with the described pendulum valve is possible not only by the pivoting movement of the valve disc 13 between the open position O and the intermediate position by means of the transverse movement, but primarily by linear movement of the valve disc 13 along the opening axis 14 between the intermediate position, i.e. the closed position by means of the longitudinal movement. The described pendulum valve can be used for highly precise control tasks.

Besides the valve seat, the valve disc 13 also has a sealing face 18. In the shown embodiment a sealing material, for example a fluoropolymer, is cured onto the sealing face 18 of the valve disc 13. The sealing material can thus be cured, for example as a polymer, onto the valve seat by means of vulcanisation. Alternatively, the seal can be embodied for example as an O-ring in a groove of the valve seat. The sealing material can also be glued onto the valve seat and can thus embody the seal. In an alternative embodiment the seal can be arranged on the valve disc 38, in particular on the sealing face 15. Combinations of these embodiments are also conceivable.

The sealing face 18 is applied in a manner corresponding, in terms of its shape and dimensioning, to the sealing face 15 of the valve seat. In the closed position of the valve the sealing face 18 of the valve disc 13 is pressed against the sealing face 15 of the valve seat, wherein a desired sealing effect (in particular gastight) is provided by means of the sealing material pressed therebetween.

A critical factor with regard to the reliability that is to be typically ensured of a working process controlled by the pendulum valve (for example in a vacuum chamber) is a potential wear of one of the sealing faces or of the sealing material itself. In order to prevent any adverse effect on the process, the sealing faces were previously carefully serviced and/or replaced at regular intervals. With the present invention, a current state of at least one of the sealing faces (and at least partially for this sealing face) can now be detected, and action, for example servicing, can be taken depending on the detected state. Maintenance phases or times can hereby be scheduled and performed in a time-optimised manner.

In accordance with the invention at least one sensor unit is provided for this purpose in order to detect a state of a sealing face. In the embodiment according to FIG. 1 two sensor units of this kind are shown. However, it shall be understood that the invention also extends to embodiments having an individual sensor unit. A combination of (at least) one sensor unit and a vacuum valve as described forms a vacuum valve system according to the invention.

The vacuum valve system according to FIG. 1 has a first sensor unit 20. The sensor unit 20 is provided outside the valve housing 11. The valve housing 11 has a first window 22, which is embodied so that measuring radiation, which is either emitted or detected (or both) by the sensor unit 20 can be transmitted through the window 22. In addition, a beam deflection element 21 (for example mirrors or prisms) is provided, by means of which the measuring radiation can be guided towards and away from a specific measurement region. The beam deflection element 21 here provides an orientation of a detection axis of the sensor unit 20 in the direction of the measurement region.

As can be seen, the transmissive window 22 is arranged so that, in an open position O, a measurement signal with respect to the sealing face 18—and thus with respect to part of the sealing material—can be obtained. In order to take a corresponding measurement, the sealing face 18 can be pressed against the window 22 or held at a certain distance.

The sensor unit 20 comprises a spectrometer 23, which enables a material analysis by means of infrared radiation. Infrared radiation, which can be aligned with the sealing face 18 through the window 22 means of the deflection element 21, thus can be omitted by means of the sensor unit 20. Following an interaction of the emitted radiation with the sealing face 18, in particular with the sealing material, the reflected radiation is then in turn detected by means of the sensor unit 20. Preferably two separate channels or optical path are provided for emission and detection.

Information regarding the material composition of the sealing face 18 or of the sealing material can be derived from a determination of the emitted radiation and the detected radiation (spectra of the two beams) as well as a comparison in this regard of the individual spectra. For example, a conclusion as to the current state of the material (for example chemical material change over a certain period of time) can be deduced by comparison with a target spectrum for the sealing material.

In general, the sensor unit 20 can be constructed in accordance with the principle of a (near) infrared spectrometer.

A second sensor unit 30 is embodied as an image detection unit (for example CCD or CMOS camera). The free end of an optical fibre 31 connected to the sensor unit 30 penetrates the valve housing 11. The free end can be embedded in the valve housing 11, for example by means of a sleeve 32 or a ferrule, such that the fibre end is placed in a fixed manner with regard to position and orientation.

In the shown variant the fibre 31 is oriented so that an image detection axis, which is determined decisively by the orientation of the fibre end, is oriented in the direction of the sealing face 15 of the valve seat. An optical module can be provided in the sleeve 32 so as to be able to detect a sharp image of the sealing face 15.

The sensor unit 30 thus makes it possible to determine the state of the sealing face 15 in the shown open position O or in any position in which the valve disc 13 does not cover the opening 12 and the valve seat. opposite the fibre end is not concealed. An image of part of the sealing face 15 can therefore be recorded, and state information can be produced on the basis of this image. For example, the detected image can be analysed by means of image processing and compared with a reference image as appropriate. For example, material residues (of the sealing material) can be identified hereby, or wear of the sealing face 15 can be ascertained. Each of these states can represent a potential cause of an increasing leak or lack of process reliability.

Alternatively to a pendulum valve as illustrated, the vacuum valve system according to the invention can be provided with another vacuum valve type, for example a flap valve, gate valve or what is known as a butterfly control valve. In particular, the system with pressure control valves is designed for use in a vacuum area. Furthermore, a pendulum valve of which the closure can be moved only in one direction can also be used.

Various embodiments of a vacuum valve system with transfer valves in different closure positions are depicted in FIGS. 2*a-d*. The embodiments differ from one another partly merely with regard to certain features, and therefore the figures will be described substantially jointly hereinafter, and in some instances only the differences between the embodiments will be discussed. Reference signs and features already explained in previous figures will not always be discussed again.

The shown transfer valve 40, 40', 40" is in particular in the form of a gate valve. The vacuum valve 40, 40', 40" has a rectangular, planar closure element 41, which has a closure face for closing on opening 42 in a gastight manner. The opening 42 has a cross-section corresponding to the closure element 41 and is formed in a wall 43. The opening 42 is surrounded by a valve seat, which provides a first sealing face 45.

The opening 42 connects a first gas region L, which is located to the left of the wall 43, to a second gas region R, to the right of the wall 43. The wall 43 is formed for example by a chamber wall of a vacuum chamber. The vacuum valve 40, 40', 40" is then formed by a cooperation of the chamber wall 43 with the closure element 41.

The closure element 41 is arranged on an adjustment arm 46, which is rod-shaped and extends along a geometric adjustment axis V. The adjustment arm 46 is mechanically coupled to a drive unit 47, by means of which the closure member 41 in the first gas region L to the left of the wall 43 can be moved, by movement of the adjustment arm 46 by means of the drive unit 47, between an open position O (FIGS. 2a and 2b), via an intermediate position (FIG. 2c), into a closed position (FIG. 2d).

Figure 2A:
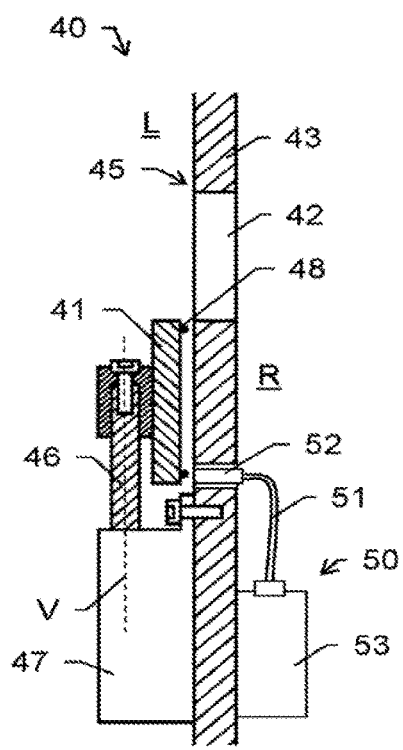

In the open position O, the closure element 41 is located outside the projection region of the opening 42 and releases this fully, as shown in FIG. 2a.

By movement of the adjustment arm 46 in the axial direction parallel to the adjustment axis V and parallel to the wall 43, the closure element 41 can be moved by means of the drive unit 47 from the open position O into the intermediate position.

In this intermediate position, the closure face covers the opening 42 and is located opposite and at a distance from the sealing face 45 of the valve seat, which sealing face surrounds the opening 42, as shown in FIG. 2c.

By movement of the adjustment arm 46 in the direction transverse to the adjustment axis V, i.e. for example perpendicularly to the wall 43 and the valve seat, the closure element 41 can be moved from the intermediate position into the closed position (FIG. 2d).

In the closed position the closure face of the closure element 41 closes the opening 42 in a gastight manner and separates the first gas region L from the second gas region R in a gastight manner.

The vacuum valve 40, 40', 40" is thus opened and closed by means of the drive unit 47 by an L-shaped movement of the closure element 41 and of the adjustment arm 46. The shown transfer valve is therefore also referred to as an L-type valve.

The closure element 41 has a further sealing face 48, which corresponds to the sealing face 45 of the valve seat. The sealing face 48 runs around the closure element and supports a sealing material. In the closed position the sealing face 48 is pressed against the sealing face 45, and the sealing material is pressed between the two sealing faces 45 and 48.

A transfer valve 40, 40', 40" as shown is typically provided to seal off a process volume (vacuum chamber) and for loading and unloading the volume. Frequent changes between the open position and the closed position are routine with a use of this kind. Increased signs of wear of the sealing faces 45 and 48 can occur as a result. At least one sensor unit is provided in accordance with the invention in order to monitor this wear. A combination of a sensor unit of this kind and a valve 40, 40', 40" forms a vacuum valve system according to the invention.

According to FIG. 2a a first sensor unit 50 having a detector 53, an optical fibre 51, and an optical component 52 providing a transmission channel through the housing 43 is provided in order to be able to identify the state of the sealing face 48. A corresponding detection is enabled with the sensor unit 50 in the open position. The optical component 52 is connected to the housing or formed therein, such that there is a gastight seal between the regions L and R in the region of the optical component 52.

Part of the sealing face 48 in the open position is located opposite the optical component 52, and measuring radiation can be detected via the optical component 52 and the optical fibre 51 by means of the detector 53. With an arrangement of this kind the sealing face 48 or a region representing the sealing face 48 can be analysed regularly, for example each time the open position is adopted, and can be assessed with regard to process reliability.

For example, variations (changes) in the sealing material over a process period can be monitored using the sensor unit 50. For example, a surface behaviour, the colour of the detectable region, a chemical composition, the shape, or soiling will be ascertained here. A change with regard to one of these factors can be used in order to deduce the quality of the sealing effect that can be produced by said sealing material. In addition, potential maintenance or a remaining service life can be predicted hereby.

The type of data that can be produced with the unit 50 is determined decisively by the embodiment of the detector 51. For example, the detector can be formed as an optical camera or spectrometer.

In the shown embodiment the detector 51 is embodied as an IR spectrometer, wherein, besides the detection of optical measuring radiation, an emission of infrared light in the direction of the sealing face 48 is also provided. To this end, the optical fibre 51 has two spatially separate optical paths: an emission optical path and a detection optical path.

Here, the infrared light can be emitted towards the sealing material and at the same time a spectrum associated with the sealing material can be detected. A material composition of the sealing material can be deduced on the basis of the spectrum (for example light intensity via wavelength) and for example can be compared with a reference for the material composition. A comparison of this kind can be made continuously during operation of the valve, and long-term monitoring of the sealing face 48 can thus be provided. For example, an ageing of the material and a resultant increasing brittleness or porosity of the material can be identified, and on this basis a matched time for a replacement of the valve disc 41 or of the seal can be established.

It shall be understood that the detector 53 alternatively is arranged separated from the wall 43. In particular, the detector 53 can be thermally and structurally decoupled from the valve unit, wherein the detection of the relevant measuring signals is provided solely by means of an accordingly dimensioned optical fibre 51 (in particular the length of the fibre).

Figure 2B:
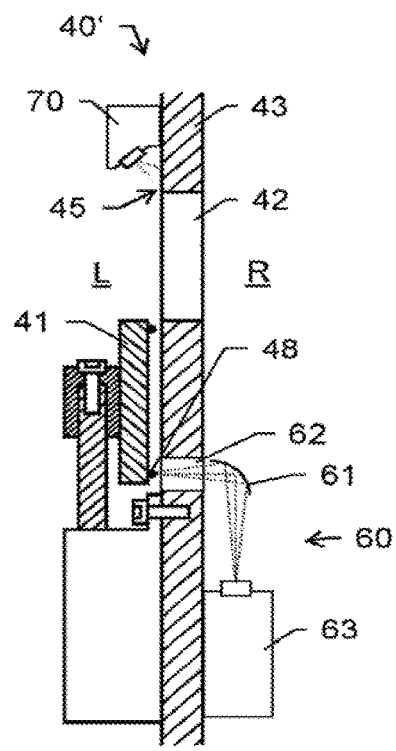

FIG. 2b shows a further embodiment of a valve system according to the invention. Instead of the sensor unit 50 from FIG. 2a, two sensor units 60, 70 of other designs are provided here. The structure of the valve 40' corresponds substantially to that of the valve 40 from FIG. 2a.

The detector 61 of the sensor unit 60 is formed as a near-infrared spectrometer for chemical analysis of the sealing face 48. For this purpose, measuring radiation with a defined spectrum in the infrared range (for example $\lambda > 800$ nm) is emitted and directed towards the sealing face 48.

A window 62 integrated into the wall 43 of the valve is provided for the sensor unit 60. The window 62, together with the wall 43, forms a gastight separation of the gas regions L and R. The opening 42 provides a closable connection of the gas regions L and R. The window 62 is in particular formed so that both the emitted measuring radiation and the measuring radiation that is to be detected by the detector 61 following interaction with the sealing face are transmitted through the window 61, practically with no loss.

A curved deflection mirror 61 is provided in order to guide and at the same time focus the measuring radiation onto the sealing material provided by the sealing face 48. An improvement of the obtained measuring signal can thus be attained, since the illumination of the sealing material can be intensified hereby. The deflection mirror 61 not only creates a focus in the direction of the sealing face 48, but also provides a corresponding detection of the measuring radiation at the detector 63.

As a result of the irradiation of the sealing face 48 or of the (polymer-based) sealing material, certain energy states in the molecules forming the particular material are excited, resulting in radiation absorption. The absorption or vibration stimulation can be identified in a spectrum that is then detected. The present material composition can be deduced on this basis.

As can be seen from FIG. 2b, a corresponding analysis with the sensor unit 60 can be performed solely in the open position of the valve 40'. It is of course conceivable that a plurality of sensor arrangements of this kind are arranged over the course of the sealing face 48 and that therefore a number of points of the sealing face 48 can be examined.

In addition, the vacuum valve system according to FIG. 2b has a further sensor unit 70. The sensor unit 70 is embodied in an integrated design and has at least one image detection sensor and an optical system. The sensor unit 70 is arranged on the valve wall or chamber wall 43 in such a way that the image detection region (field of view, FoV) thereof is aligned with the sealing face 45 and at least some of the sealing face 45 can be visually captured by means of the sensor unit 70. The sensor unit 70 or housing thereof is designed so that there is a gastight seal with respect to the gas volume L.

A sensor unit 70 of this kind can be arranged for example within a vacuum volume and can thus allow a monitoring of an inwardly arranged sealing face. The gas region L is then equated to the inner volume of a vacuum process chamber.

FIG. 2c shows a further embodiment of a valve system according to the invention, wherein the gate valve 40" is present here in an intermediate position. In the intermediate position the valve disc 41 is positioned opposite the valve opening 42, wherein the sealing faces 45 and 48 do not touch one another.

The valve system of FIG. 2c comprises a transfer valve 40" and a sensor unit 70. The sensor unit 70—as according to FIG. 2b—is provided in order to produce state information for the wall-side sealing face 45. In the intermediate position it is in particular still possible, using the camera unit 70, to scan at least part of the sealing face region that is to be scanned, since the sealing face 45 is not fully covered by the valve disc 41. The state information can thus be produced hereby. The sensor unit 70 can be formed in particular as a line sensor for the matched monitoring of a seal extending linearly at least in part.

In FIG. 2d the valve system comprising valve 40" and sensor 70 is shown in a closed positioning of the valve disc 41. The sealing face 48 of the valve disc 41 is pressed here against the sealing face 45 of the valve wall 43. The sealing face 48 of the valve disc 41 is thus covered by the sealing face 45 of the valve wall 43 and is no longer accessible for the capturing of an image by means of the unit 70.

FIG. 3 shows a further embodiment of a valve system according to the invention comprising a transfer valve 40''' and a sensor unit. The valve 40''' itself is embodied substantially similarly to a valve 40, 40', 40" from one of FIGS. 2a-2d.

The difference from the systems shown previously lies in that, in this embodiment, the state information can be produced on the basis of measurement data which can be detected from the direction of the rear side of the sealing face 48. To this end, the valve disc 41 has an inner optical path 81. The optical path 81 is embodied for example by an optical fibre. One end of the optical fibre is coupled to the rear side of the sealing face 48. Here, the sealing face 48 can be embodied in particular in a permeable manner for the measuring radiation to be recorded or emitted through the optical fibre, for example can be embodied as a transparent window area.

The optical path 81 is connected to the sensor 83 by means of a (further) optical fibre 82. The sensor 83 is preferably formed as a camera or line sensor, wherein images can be captured from the rear side of the sealing face 48. The optical path 81 can be provided for example in a manner running around along the sealing face 48, or at least one point on the sealing face rear side is accessible through the optical path 81. The images can be captured from the rear side accordingly.

By means of an image comparison (target-actual comparison), a current state of the sealing face 48, in particular of the polymer-based sealing material applied to the sealing face 48, can then be deduced.

For example, detachments of the sealing material from the sealing face 48 or any other impairment of the seal assembly can thus be ascertained.

It shall be understood that the sensor 83 can be formed alternatively as a spectrometer with a beam source for the measuring radiation and with a detector for detecting the measuring radiation after interaction with the sealing face 48. Two separate optical paths are then preferably provided for the emitting and for the receiving of the measuring radiation and can be provided with a specific optical fibre.

It shall be understood that the depicted figures schematically depict only possible exemplary embodiments. The various approaches can also be combined in accordance with the invention with one another and with vacuum valves and vacuum processes of the prior art.

The invention claimed is:

1. A vacuum valve system comprising a
   vacuum valve for controlling a volume flow or mass flow and/or for gastight sealing off a process volume, wherein the vacuum valve has
   a valve seat, which runs for closing the valve opening in a gas-tight manner, and
   at least two sealing faces, wherein
     a first sealing face of the at least two sealing faces is provided by the valve seat and runs around the valve opening, and
     a second sealing face of the at least two sealing faces is provided by the valve closure and is formed correspondingly to the first sealing face,
   a drive unit coupled to the valve closure, which drive unit
     is designed in such a way that the valve closure
     can be varied and adjusted in a defined manner in order to provide respective valve opening states and
     is movable from an open position, in which the valve closure at least partially releases the valve opening, into a closed position, in which the second sealing face is pressed in the direction of the first sealing face and the valve opening is closed in a substantially gastight manner, and back, wherein the vacuum valve system has an optical sensor unit, wherein the optical sensor unit is designed to detect an optical measurement signal and is arranged in such a way, and an optical detection axis of the optical sensor unit is oriented in such a way that the measurement signal with respect to at least part of one of the sealing faces can be detected, wherein the measurement signal can be generated in a test position of the valve closure.

2. The vacuum valve system according to claim 1, wherein the measurement signal with respect to at least part of one of the sealing faces can be generated only in a certain test position of the valve closure.

3. The vacuum valve system according to claim 1, wherein the vacuum valve defines a vacuum region separated from an outer environment.

4. The vacuum valve system according to claim 3, wherein the optical sensor unit is arranged at least in part within the vacuum region and the detection axis is oriented in the direction of the valve seat for detection of the optical measurement signal for the second sealing face.

5. The vacuum valve system according to claim 1, wherein the vacuum valve has a transmission window permeable at east for the optical measurement signal.

6. The vacuum valve system according to claim 5, wherein the optical sensor unit is arranged in the outer environment in such a way that the optical measurement signal can be detected via the transmission window by means of the optical sensor unit.

7. The vacuum valve system according to claim 5, wherein the transmission window forms at least part of one of the at least two sealing faces.

8. The vacuum valve system according to claim 1, wherein the optical sensor unit comprises an optical fibre for detecting and guiding the optical measurement signal.

9. The vacuum valve system according to claim 1, wherein the optical sensor unit is connected to the valve closure.

10. The vacuum valve system according to claim 1, wherein the optical sensor unit comprises a beam detection module, with a camera, an infrared detector, a scattered light sensor and/or a Raman detector.

11. The vacuum valve system according to claim 1, wherein the vacuum valve system comprises a processing unit formed in such a way that a detected measurement signal can be processed by means of the processing unit and state information can be generated on the basis of the detected measurement signal.

12. The vacuum valve system according to claim 11, wherein the state information provides information regarding a chemical, mechanical and/or structural integrity of the first or second sealing face and/or the state information is generated by means of image processing and/or by means of an actual-target comparison for the detected measurement signal.

13. The vacuum valve system according to claim 11, wherein based on the state information, a material composition and/or change to the material composition can be deduced for at least the detectable part of one of the at least two sealing faces.

14. The vacuum valve system according to claim 11, wherein the state information is produced as a visual representation of at least the detectable part of one of the at least two sealing faces, or a graph embodying spectroscopic measurement signals, or an output signal specifying a relation of the detected measurement signal to a specific tolerance value.

15. The vacuum valve system according to claim wherein the valve seat is formed by a part of the vacuum valve structurally connected to the vacuum valve, or is provided by a process chamber.

16. The vacuum valve system according to claim 8, wherein at least part of the optical fibre is present in the vacuum region and is arranged and oriented to detect the optical measurement signal for at least one of the at least two sealing faces.

17. The vacuum valve system according to claim 9, wherein the optical sensor unit is integrated at least in part in the valve closure.

* * * * *